United States Patent [19]

Suptitz

[11] Patent Number: 5,066,920
[45] Date of Patent: Nov. 19, 1991

[54] CORRECTION PROCEDURE OF THE PHASE DIFFERENCE INTRODUCED BY A ZERO SEQUENCE TOROID OF LEAKAGE CURRENT AND ISOLATION MONITOR THIS PROCEDURE

[75] Inventor: Eric Suptitz, Grenoble, France

[73] Assignee: Merlin Gerin, France

[21] Appl. No.: 526,909

[22] Filed: May 22, 1990

[30] Foreign Application Priority Data

May 22, 1989 [FR] France .................... 89 06769

[51] Int. Cl.$^5$ .................................. G01R 31/02
[52] U.S. Cl. .............................. 324/544; 324/510; 324/521; 324/523
[58] Field of Search ............ 324/544, 522, 523, 521, 324/551, 509, 510

[56] References Cited

U.S. PATENT DOCUMENTS

| | | | |
|---|---|---|---|
| 4,857,830 | 8/1989 | Matsuno | 324/521 |
| 4,857,855 | 8/1989 | Matsuno | 324/522 |
| 4,896,115 | 1/1990 | LeMaitre et al. | 324/551 |

FOREIGN PATENT DOCUMENTS 2542811 11/1976 Fed. Rep. of Germany.

OTHER PUBLICATIONS

Patent Abstract of Japan, vol. 7, No. 241 (P-232) [1386] Oct. 26, 1983.
Patent Abstracts of Japan, vol. 12, No. 453 (P-792) [3300] Nov. 29, 1988.
Patent Abstracts of Japan, vol. 12, No. 492 (P-804) [3339] Dec. 22, 1988.

Primary Examiner—Kenneth A. Wieder
Assistant Examiner—Robert W. Mueller
Attorney, Agent, or Firm—Parkhurst, Wendel & Rossi

[57] ABSTRACT

A digital isolation monitor comprises a signal processor operating in conjunction with a measuring circuit to perform a first no-load measurement and a second load measurement of a zero sequence signal delivery by a toroid of a differential transformer, followed by synchronous demodulation. A microcontroller computes the tangent of the angle of phase difference introduced by the toroid by computing the relationship between the load and no-load components, and determines the true values of the leakage resistance and stray capacitance of the power system.

14 Claims, 3 Drawing Sheets

CORRECTION PROCEDURE OF THE PHASE DIFFERENCE INTRODUCED BY A ZERO SEQUENCE TOROID OF LEAKAGE CURRENT AND ISOLATION MONITOR THIS PROCEDURE

BACKGROUND OF THE INVENTION

The invention relates to a measuring procedure and apparatus of a leakage current using a differential detection transformer, and a generator injecting a reference AC signal.

A state-of-the-art measuring procedure consists in:

continuously injecting a reference AC signal between the power system and ground, taking a measurement signal Vd proportional to the leakage current Id flowing in the leakage impedance Zd at the terminals of a measurement winding of a differential transformer with a toroid around the power system conductors, analyzing the measurement signal in phase and amplitude by synchronous detection to discriminate between the resistive and capacitive components, computing and displaying the individual values of the leakage resistance R and of the stray capacitance C of the power system responsible for the leakage current Id. A procedure of this kind is described in the document FR-A 2,616,228.

Monitoring of the isolation of an electrical power distribution system is achieved by analyzing the leakage current Id flowing in the leakage impedance Zd, which is composed of a leakage resistor R connected in parallel to a stray capacitor C (see FIG. 1 of the state of the art). The leakage current Id is created by a generator G which continuously injects into the power system 10, via a filter, a reference AC signal, having a voltage U whose frequency is lower than that of the power system 10. The injection frequency chosen is lower than the power system frequency in order to limit the influence of the stray capacitance C. The leakage resistance R corresponds to the actual isolation fault, and the capacitance C corresponds to the stray capacitances of the lines of the power system 10. The capacitive impedance $1/C\omega$ is generally much higher than the resistance R which it is proposed to measure to deduce the isolation level. To isolate the resistive component Ir, the phase difference between the leakage current Id and the injected voltage U of the reference signal has to be able to be measured very accurately. The precision must be in the order of a minute of an angle.

According to FIG. 1, the leakage current Id is measured by means of a differential transformer with a zero sequence toroid 12 disposed around the conductors of the power system 10. The measurement signal Vd generated at the terminals of a load resistor r connected in parallel to the measurement winding 14, is applied to an amplifier 16, and then analyzed by a synchronous detector device 18 which is controlled by control signals C1 and C2 respectively in phase and in phase quadrature with the injected voltage U. Operation of the synchronous detector device 18 is well-known to those specialized in the art and is apparent from the above-mentioned document FR-A 2,616,228.

The output of the synchronous detector device 18 delivers two voltage signals UR and UC respectively proportional to the leakage resistance R, and to the capacitive impedance $1/C\omega$. A computing and display device 20 then indicates the values of the leakage resistance R and of the stray capacitance C. These values would be true if the toroid differential transformer 12 was perfect. State-of-the-art differential transformer technology enables a fairly good precision to be obtained on the amplitude of the signal delivered by the measurement winding 14. The precision on the phase measurement of the leakage signal is, on the other hand, not so good. This difference in precision can be explained by the fact that the error committed on the leakage current amplitude depends on the magnetic permeability of the material of the toroid 12 to the second order only, whereas the error on the phase measurement is a first order function of the same permeability which varies with temperature. This results in the toroid differential transformer 12 introducing an additional phase difference "A" between the leakage current Id and the secondary voltage of the measurement signal Vd of the measurement winding 14. This phase difference A makes the values of R and C displayed by the device 20 in FIG. 1 false. Apart from the influence of the temperature on the permeability, it has moreover been noted that the phase difference A depends on the intensity of the leakage current Id. These different parameters cause a fluctuation of the phase difference A over time which affects the measurement precision. This phase difference fluctuation is unpredictable, and therefore very difficult to model.

It has already been proposed to improve the measurement precision by connecting a capacitor in parallel on the secondary winding 14 of the toroid 12 to form an oscillating circuit tuned to the frequency of the injected voltage U. The phase difference measurement precision is then in the order of five minutes of an angle, which is not compatible with the very high phase difference precision required with a synchronous detector device.

According to another state-of-the-art technique, all the parameters of the toroid 12 are stored in a memory of an isolation monitor equipped with a digital processor. The complexity of the software sequences implemented to take these parameters into account individually in computing the leakage resistance R and the capacitance C makes the processing time of the program longer, and does not however enable the necessary performances to be achieved.

A first object of the invention consists in achieving a simple phase difference correction procedure to improve the measurement precision of a leakage current detected by a differential transformer.

SUMMARY OF THE INVENTION

The procedure is characterized by the following intermediate stages:

the no-load voltage and the load voltage of the measurement signal Vd delivered by the differential transformer are measured, the phase difference introduced by the toroid between the leakage current Id and the measurement signal Vd is determined on-line, by dividing the amplitude of the load voltage by the amplitude of the no-load voltage, enabling a ratio assimilated to the tangent of the angle of phase difference to be obtained, a phase correction is performed by means of said ratio on the resistive and capacitive components to obtain the true phase of the leakage current Id, and the true values of the leakage resistance R and of the stray capacitance C.

The modeling equations of a toroid show that the voltage of the measurement signal Vd at the terminals of the load resistor r (see FIG. 2) has the following expression:

$$Vd = jL2\omega / (r + jL2\omega) \cdot r \, N1 \cdot Id / N2 \quad (1)$$

L2 being the inductance of the measurement winding 14 proportional to the square of N2
and N1 and N2 being the number of primary and secondary turns of the toroid 12.

The load measurement shows that the tangent of the angle of phase difference between the current Id and the measurement signal voltage Vd on the one hand, and the voltage module Vd on the other hand, have the following expressions respectively:

$$\tan A = r / L2 \cdot \omega \quad (2)$$

$$\|Vd\| = rL2 \cdot \omega / \sqrt{r2 + (L2 \cdot \omega)^2} \quad (3)$$

It can moreover be noted that the no-load voltage module and the load voltage module of the measurement signal Vd are represented by the following formulae:

$$\|Vd \text{ no-load}\| = L2\omega N1.Id / N2 \quad (4)$$

$$\|VD \text{ load}\| = r \, N1.ID / N2 \quad (5)$$

It results from the relationships (4) and (5) that the ratio of the load voltage module over the no-load voltage module of the measurement signal Vd corresponds to the value of the tangent of the angle of phase difference A defined in relationship (2). Whence the following relationship:

$$\|Vd \text{ load}\| / \|Vd \text{ no-load}\| = \tan A \, r / L2\omega. \quad (6)$$

Consequently the amplitude of the load voltage merely has to be divided by the amplitude of the no-load voltage of the measurement signal Vd to determine the tangent of the angle of phase difference A.

Division of the load and no-load voltage amplitudes of the differential transformer measurement signal is performed periodically so as to obtain an evolution of the angle of phase difference over time.

Synchronous detection is performed by means of two control signals C1 and C2 in phase quadrature, one of these signals C1 being in phase with the injected reference AC signal. Phase correction is performed after synchronous detection by angle rotation of the resistive and capacitive components.

This phase correction depends on the following relationship:

$$\begin{bmatrix} UR1 \\ UC1 \end{bmatrix} = \begin{bmatrix} \cos A & -\sin A \\ \sin A & \cos A \end{bmatrix} \begin{bmatrix} UR \\ UC \end{bmatrix} \quad (7)$$

UR and UC representing the wrong values of the two voltage signals delivered by the synchronous device 18, UR1 and UC1 being the true values after phase correction of UR and UC. The angle rotation A is very small (in the order of 1 to 2 degrees).

It can be considered by approximation that $\cos A = 1$ and $\sin A = \tan A$

This results in the following simplified relationships:

$$\begin{bmatrix} UR1 \\ UC1 \end{bmatrix} = \begin{bmatrix} 1 & -\tan A \\ \tan A & 1 \end{bmatrix} \begin{bmatrix} UR \\ UC \end{bmatrix} \quad (8)$$

whence the relationships:

$$UR1 = UR + UC \tan A \quad (9)$$

$$UC1 = UC - UR \tan A \quad (10)$$

which define the phase correction procedure.

Phase correction is performed by adding to the resistive component of the measurement signal a first corrected quantity corresponding to the product of the capacitive component of said measurement signal by the tangent of the angle of phase difference A.

Angle correction is performed by subtracting from the capacitive component of the measurement signal after synchronous detection, a second corrected quantity corresponding to the product of the resistive component of said measurement signal by the tangent of the angle of phase difference A.

A second object of the invention consists in achieving a reliable isolation monitor using the phase difference correction procedure described above.

According to a first embodiment, the isolation monitor comprises an electronic circuit with analog components using the above relationships 6, 9 and 10.

According to a second embodiment, the isolation monitor comprises a digital electronic circuit.

BRIEF DESCRIPTION OF THE DRAWINGS

Other advantages and features will become more clearly apparent from the following description of two illustrative embodiments of the invention, given as non-restrictive examples only and represented in the accompanying drawings, in which.

DESCRIPTION OF THE PREFERRED EMBODIMENT

Figure 1:
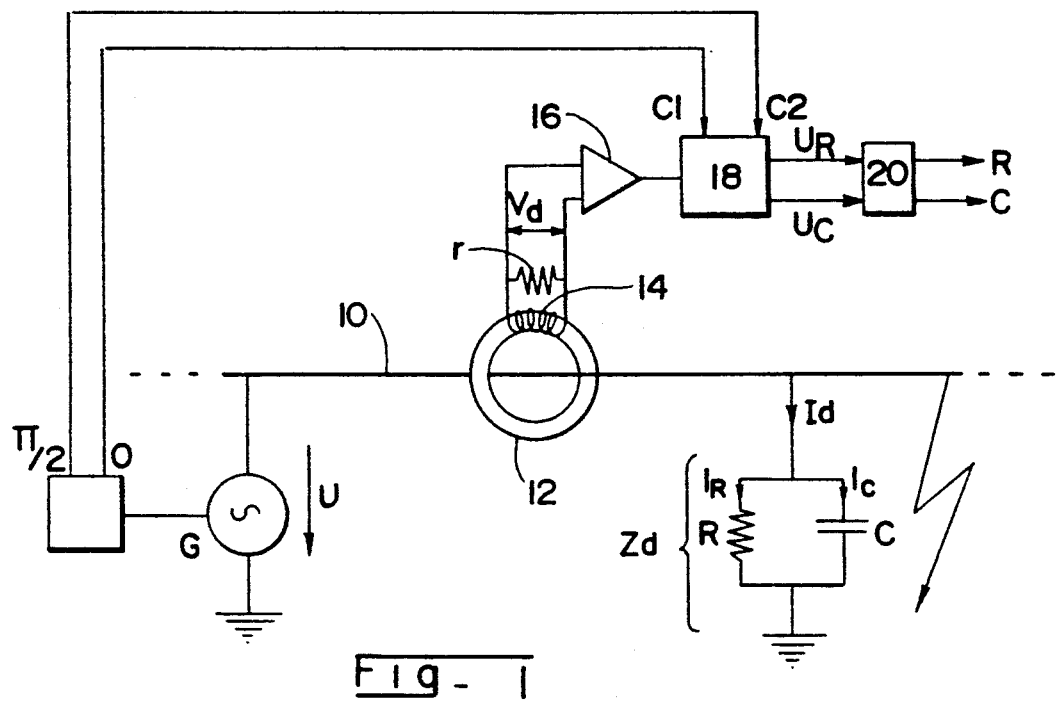
FIG. 1 shows a state of the art system for monitoring the isolation of an electrical power distribution system.
Figure 2:
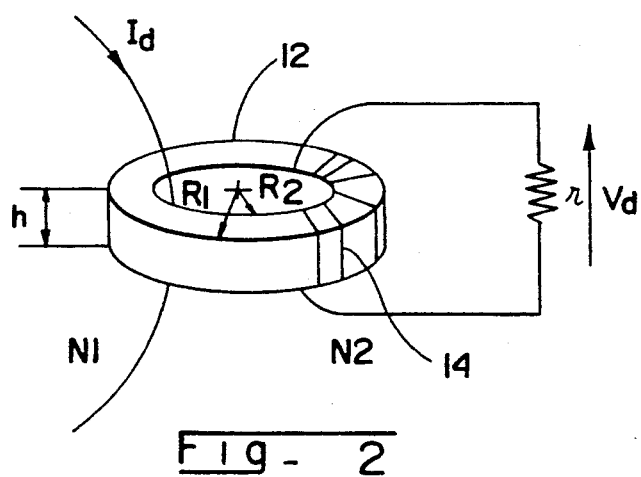
FIG. 2 shows a differential transformer with a zero sequence toroid for measuring leakage current.
Figure 3:
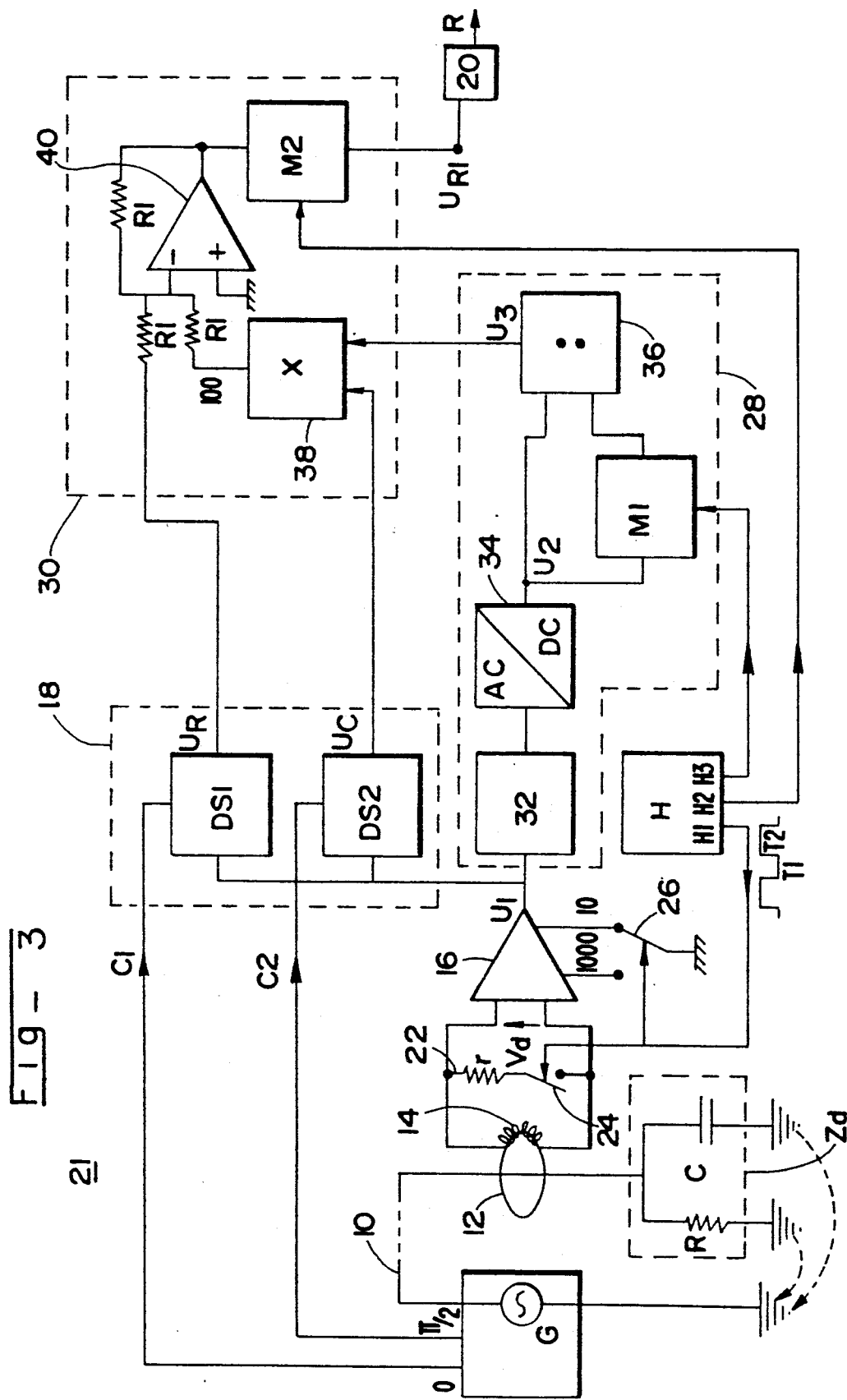
FIG. 3 shows the block diagram of an analog isolation monitor.

In the analog isolation monitor 21 in FIG. 3, the same reference numbers will be used to designate identical or similar components to those of the state-of-the-art device in FIG. 1. The measurement winding 14 of the toroid 12 has connected to it in parallel a measuring circuit 22 comprising the load resistor r in series with a first static switch 24. The measurement signal Vd is amplified in an amplifier 16 with gain possibilities, one of which is high (about 1000), and the other low (about 10). Programming of the gain of the amplifier 16 is managed by a second static switch 26. A timer H delivers a first clock signal H1 having half-waves of a time T1, T2 to the two static switches 24, 26, and two other clock signals H2 and H3 for control of the memory circuits M1 and M2.

The output of the amplifier 16 is connected on the one hand to the input of the synchronous detector device 18 having two synchronous detector circuits DS1 and DS2 controlled by control signals C1 and C2, and on the other hand to a computation circuit 28 of the tangent of the phase difference A between the leakage current Id and the measurement signal voltage Vd.

A compensating circuit 30 cooperates with the computation circuit 28 and the two synchronous detector circuits DS1 and DS2 to correct the phase difference A introduced on the line by the toroid 12.

The computation circuit 28 comprises a switched capacitance filter 32 eliminating the power system frequency (50 Hz or 60 Hz), and connected in series with an AC-DC converter 34 containing a rectifier and a smoothing filter. The output of the converter 34 is connected on the one hand to a first memory circuit M1 formed by a sample-and-hold circuit controlled by the third clock signal H3, and on the other hand to a dividing circuit 36 which delivers to the compensating circuit 30 an output signal U3 representative of the tangent of the angle of phase difference A.

The compensating circuit 30 is equipped with a multiplier circuit 38 which receives the output signal U3 from the dividing circuit 36, and the voltage signal UC from the synchronous detector circuit DS2. An adder circuit 40 is connected to the outputs of the multiplier circuit 38 and of the synchronous detector circuit DS1 in such a way as to deliver the voltage signal UR1 after storing in the memory circuit M2.

Operation of the analog isolation monitor according to FIG. 3 is as follows:

During the time interval T1 of the first clock signal H1, the first no-load measurement phase takes place after disconnection of the load resistor r, following opening of the first static switch 24. The voltage of the measurement signal Vd of the differential transformer is amplified by the amplifier 16 programmed on the low gain ($\times 10$) by the second switch 26. The output voltage U1 of the amplifier 16 is filtered in the filter 32 to eliminate interference at the power system frequency of 50 Hz, and is then converted by the converter 34 into a DC voltage signal U2. The signal U2 is representative of the no-load voltage of the measurement signal Vd, and is stored in the first memory circuit M1.

The second load measurement phase takes place during the second time interval T2 of the first clock signal H1. The load resistor r is then connected to the terminals of the measurement winding 14 of the toroid 12 after the first static switch 24 has closed. The voltage signal Vd is amplified by the amplifier 16 programmed on the high gain ($\times 1000$) by the second static switch 26, as the load voltage is about one hundred times lower than the no-load voltage. The output voltage U1 is converted by the converter 34 into a DC voltage signal U2, as described above. At the same time, the voltage U1 is applied to the two synchronous detector circuits DS1, DS2, respectively delivering DC voltage signals UR and UC, which are polluted by the phase difference A introduced by the differential transformer. During the latter measurement phase, the DC voltage signal U2 is representative of the load voltage of the measurement signal Vd, which is introduced in the numerator of the dividing circuit 36. The no-load voltage stored in the first memory circuit M1 during the time interval T1 preceding T2 is then injected in the denominator of the dividing circuit 36. The voltage U3 of the dividing circuit 36 is proportional to the phase difference A and represents in fact 100 tan A. After the voltages U3 and UC have been multiplied in the multiplier circuit 38, and this result, attenuated one hundred times with the voltage UR, has been added in the adder circuit 40, the true voltage UR1 is obtained at the output of the adder circuit 40 after phase correction of the voltage UR. The voltage UR1 complies with the relationship (9) above ($UR1 = UR + UC \tan A$) and is directly proportional to the leakage resistance R, regardless of the variations of the phase difference A connected with the parameters of the toroid 12.

It is also possible to isolate the component UC1 to determine the stray capacitance C of the power system. The implementation means are not represented in FIG. 3, but are derived from the relationship (10) above, ($UC1 = UC - UR \tan A$). In fact the voltages UR and U3 merely have to be multiplied in a multiplier circuit, and the result then subtracted from the voltage UC.

The voltage signal UR1 is stored by the memory circuit M2 which thus keeps the last measured value during the time interval T1 of the first no-load measurement phase.

The voltage UR1 is processed in the computing and display device 20 which directly indicates the true value of the leakage resistance R in ohms.

Figure 4:
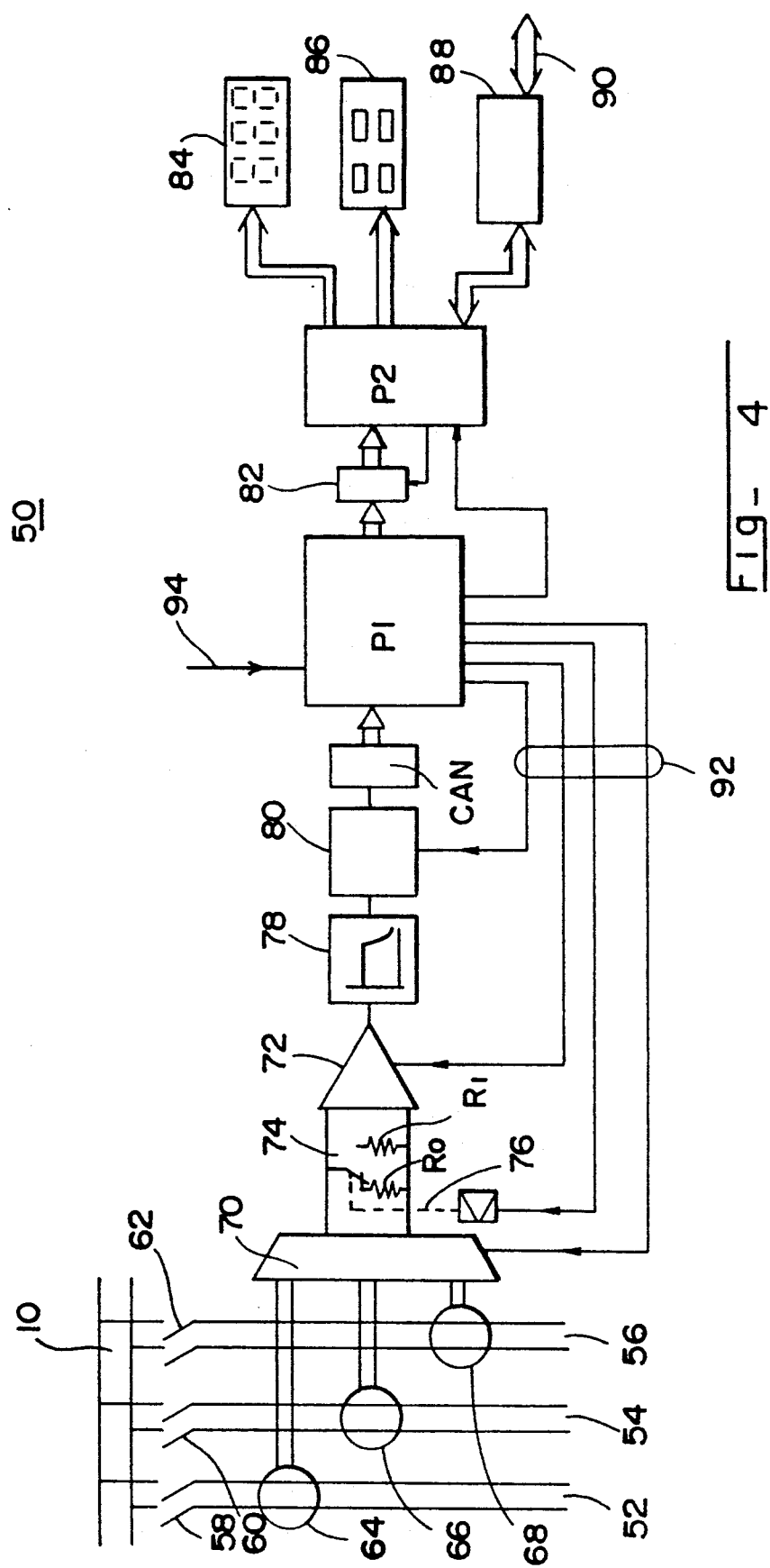
FIG. 4 represents the block diagram of a digital isolation monitor.

Referring now to FIG. 4, a digital isolation monitor 50 is designed to measure the isolation resistances in several feeders 52, 54, 56 of an AC power system 10. An injection circuit (not shown) of the monitor 50 injects a sinusoidal signal at very low frequency (for example 10 Hz) between the power system 10 and ground. Each feeder 52, 54, 56 . . . comprises a main circuit breaker 58, 60, 62, and a differential transformer with a toroid 64, 66, 68 disposed around the active conductors of the feeder. The injected current is ground-looped by the isolation impedances of the feeders 52, 54, 56, located down-line from the toroids 64, 66, 68.

The measurement windings of the different toroids 64, 66, 68 are connected to an analog multiplexer 70 whose output is connected to an amplifier 72 via a measuring circuit 74. The latter comprises a selector relay 76 of a no-load resistor R0 and a load resistor R1. The output of the amplifier 72 is connected to a digital signal processor P1 by means of a spectrum antialiasing filter 78, a sample-and-hold circuit 80 and an analog-to-digital converter CAN.

The signal processor P1 is connected by means of an electronic latch 82 to a microcontroller P2, which is associated with an alphanumeric read-out 84, a keyboard 86 to enter the parameters, and a communication interface 88 with an external bus 90.

An internal bus 92 enables the multiplexer 70, the selector relay 76, the amplifier 72 and the sample-and-hold circuit 80 to be controlled by the processor P1.

Operation of the digital isolation monitor 50 according to FIG. 4 is as follows:

The processor P1 receives, via a conductor 94, an information signal from the injection circuit (not shown) to know the phase reference of the signal applied to the power system. The processor P1 then operates in conjunction with the multiplexer 70 to trigger an isolation measurement on one of the feeders 52, 54, 56. The first phase of this measurement involves selection of the no-load resistor R0 by the relay 76, followed by sampling of the measurement signal over several periods after the gain of the amplifier 72 has been adjusted. The processor P1 then performs digital filtering of the digitized signal to eliminate interference and noise, and then determines, after synchronous demodulation, the resistive and capacitive components of the signal image of the fault impedance measured by the toroid in conjunction with the no-load resistor R0.

In the second phase, the processor P1 selects the load resistor R1 by means of the relay 76, and runs the procedure again to determine the new load components of the signal from the toroid.

In the third phase, the signal processor P1 sends the values of the components obtained on no-load and on load, and the respective gain of the amplifier 72, to the microcontroller P2. The signal processor P1 is then ready to perform a measurement on another feeder, whereas the microcontroller P2 computes the tangent of the angle of phase difference A introduced by the corresponding toroid, and the true values of the leakage resistance R and of the stray capacitance C of the feeder using the above-mentioned relationships (6, 9 and 10) of the procedure. The values of R and C are then displayed on the read-out 84.

The measuring precision can be further improved by using an ohmmeter (not shown) designed to operate in conjunction with the first switch 24 (FIG. 3), or the relay 76 (FIG. 4) to measure the electrical resistance of the measurement winding 14 of the associated toroid 12, 64, 66, 68. This additional measurement enables the variations in resistance of the measurement winding 14 in terms of the temperature to be overcome.

I claim:

1. A procedure for measuring a phase difference introduced by a toroid in a system for monitoring an earth leakage current indicative of isolation in an electrical power system having at least one conductor, said procedure comprising the steps of:
   continuously injecting an AC reference signal having a frequency less than that of said power system on to said at least one conductor in such a manner that said signal is injected between said conductor and a ground;
   disposing a differential transformer including a zero sequence toroid around said conductor and connecting a switchably engaged load across the terminals of said toroid and in parallel therewith;
   measuring with said differential transformer a signal propagating through said conductor which is indicative of a leakage current propagating through a ground fault of said conductor;
   said measuring step further including the steps of measuring at least an amplitude of a no-load voltage across said terminals, when said load is not engaged, and measuring an amplitude of a load voltage across said terminals at a second frequency, when said load is engaged;
   obtaining a predetermined ratio assimilated to the tangent of the angle of phase difference by dividing said load voltage amplitude by said no-load voltage amplitude;
   analyzing a phase and magnitude of said measured signal to discriminate between and to obtain resistive and capacitive components thereof; and
   mathematically combining said ratio and said resistive and capacitive components to obtain an essentially true measure of said phase difference introduced by said toroid.

2. The measuring procedure according to claim 1, wherein the analyzing step to discriminate between components includes the step of synchronously detecting the measured signal to obtain said components.

3. The measuring procedure according to claim 2, wherein synchronous detection is performed by means of two control signals in phase quadrature, one of these signals being in phase with the injected reference AC signal, and phase correction is performed after synchronous detection by angle rotation of the resistive and capacitive components.

4. The measuring procedure according to claim 3, wherein angle correction is performed by subtracting from the capacitive component of the measured signal after synchronous detection, a second corrected quantity corresponding to the product of the resistive component of said measured signal by the tangent of the angle of phase difference.

5. The measuring procedure according to claim 1, wherein the analyzing step to discriminate between components includes the step of demodulating the measured signal to obtain said components.

6. The measuring procedure according to claim 1, further comprising the step of:
   computing individual values of leakage resistance and leakage capacitance between said conductor and ground; and
   displaying said leakage resistance and capacitance on a display means.

7. The measuring procedure according to claim 1, wherein division of the load and no-load voltage amplitudes of the differential transformer measurement signal is performed periodically so as to obtain an evolution of said phase difference over time.

8. The measuring procedure according to claim 1, wherein phase correction is performed by adding to the resistive component of the measured signal, a first corrected quantity corresponding to the product of the capacitive component of said measured signal by the tangent of the angle of phase difference.

9. An apparatus for measuring a phase difference introduced by a toroid in a system for monitoring an earth leakage current indicative of isolation in an electrical power system having at least one conductor, said apparatus comprising;
   means for continuously injecting an AC reference signal having a frequency less than that of said power system into said at least one conductor in such a manner that said signal is injected between said conductor and a ground;
   differential transformer means including a zero sequence toroid positioned around said conductor and load means engagably connected across the terminals of said toroid and in parallel therewith, said differential transformer means detecting a signal propagating through said conductor which is indicative of a leakage current propagating through a ground fault of said conductor;
   means for measuring from said detected signal at least an amplitude of a no-load voltage applied across said terminals when said load is not engaged, and an amplitude of a load voltage applied across said terminals, when said load is engaged;
   means for dividing said load voltage amplitude by said no-load voltage amplitude to obtain a predetermined ratio assimilated to the tangent of the angle of phase difference;
   means connected to said measuring means for analyzing a phase and magnitude of said detected signal to discriminate between and to obtain resistive and capacitive components thereof; and means connected to said analyzing and dividing means for mathematically combining said ratio and said resistive and capacitive components to obtain an essentially true measure of said phase difference introduced by said toroid.

10. The apparatus of claim 9, wherein said means for measuring means comprises:
a variable gain amplifier for receiving said signal detected by said transformer;
filter means for filtering an output of said amplifier to eliminate a power system frequency;
amplifier gain control means including a static switch controlled by a timer;
AC-DC converting means inserted between said filter and a first input of a dividing circuit;
memory means controlled by said timer and connected between said converting means and a second input of said dividing circuit; and
said dividing circuit performing a division operation which produces a signal representative of said tangent of said phase difference.

11. The apparatus of claim 10, wherein the measuring means further comprises:
a multiplier circuit receiving the output signal from the dividing circuit, and the capacitive component from the analyzing means;
an adder circuit receiving the output signal from the multiplier circuit and the resistive component from the analyzing means; and
a second memory circuit controlled by said timer to store an essentially true resistive component of said phase difference.

12. The apparatus of claim 9, further comprising:
digital processor means for controlling measurement of the measured signal;
selector relay means for alternatively selecting a no-load and load resistance across the terminals of said toroid;
signal processor means, located in said processor means, for controlling an operation of said relay means; and
electronic latch means enabling data from said measured signal to be transmitted to a microcontroller means, said microcontroller means computing both said tangent of the angle of phase difference and essentially true values of leakage resistance and stray capacitance associated with said leakage current.

13. The apparatus of claim 12, further comprising an ohmmeter operating in conjunction with said selector relay means to measure an electrical resistance of a measurement winding of said toroid.

14. The apparatus of claim 9, wherein a multiplexer means is provided between said power system and said measuring means for switchably connecting different conductors in said power system to said measuring means.

* * * * *